(12) United States Patent
Tzafrir et al.

(10) Patent No.: US 10,924,113 B2
(45) Date of Patent: Feb. 16, 2021

(54) DYNAMIC CALIBRATION OF FREQUENCY AND POWER STORAGE INTERFACE

(71) Applicant: Western Digital Technologies, Inc., San Jose, CA (US)

(72) Inventors: Yonatan Tzafrir, Petah Tikva (IL); Mordekhay Zehavi, Raanana (IL); Eyal Widder, Hod HaSharon (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/964,027

(22) Filed: Apr. 26, 2018

(65) Prior Publication Data

US 2019/0058474 A1 Feb. 21, 2019

Related U.S. Application Data

(63) Continuation-in-part of application No. 15/679,468, filed on Aug. 17, 2017, now Pat. No. 10,466,920.

(51) Int. Cl.
*G11C 8/00* (2006.01)
*H03K 19/003* (2006.01)
*G06F 1/08* (2006.01)
*G11C 7/22* (2006.01)
*G11C 29/02* (2006.01)
*G11C 7/04* (2006.01)

(52) U.S. Cl.
CPC ......... *H03K 19/00384* (2013.01); *G06F 1/08* (2013.01); *G11C 7/04* (2013.01); *G11C 7/222* (2013.01); *G11C 29/021* (2013.01); *G11C 29/023* (2013.01); *G11C 29/028* (2013.01); *G11C 2207/2254* (2013.01)

(58) Field of Classification Search
CPC ..... H03K 19/00384; G06F 1/08; G11C 7/222; G11C 29/023; G11C 7/04; G11C 29/021; G11C 29/028; G11C 2207/2254
See application file for complete search history.

(56) References Cited

U.S. PATENT DOCUMENTS

| | | | |
|---|---|---|---|
| 7,446,592 | B2 | 11/2008 | Tripathi et al. |
| 7,800,975 | B2 | 9/2010 | Rombach et al. |
| 8,411,517 | B2 | 4/2013 | Choi |
| 8,484,522 | B2 | 7/2013 | Flynn et al. |
| 8,520,455 | B2 | 8/2013 | Ross et al. |

(Continued)

OTHER PUBLICATIONS

Micron; "3D NAND Flash Memory"; 2016; Micron Technologies Inc.; (2 pages) 2016.

(Continued)

*Primary Examiner* — Uyen Smet
(74) *Attorney, Agent, or Firm* — Patterson & Sheridan, LLP; Steven H. Versteeg

(57) ABSTRACT

A data storage device includes a controller and a memory. The controller includes a host interface and a memory interface. The controller receives inputs from the host, internal storage device inputs, device lifetime calculations, temperature readings and voltage readings. The controller then dynamically adjusts the frequency and voltage for the memory interface based upon the inputs received. As such, the memory interface operates are optimum conditions.

11 Claims, 9 Drawing Sheets

(56) References Cited

U.S. PATENT DOCUMENTS

| | | |
|---|---|---|
| 2005/0125181 A1* | 6/2005 | Norman .................. H03K 3/011 |
| | | 702/107 |
| 2006/0031710 A1 | 2/2006 | Jo |
| 2006/0140287 A1 | 6/2006 | Alon et al. |
| 2007/0018712 A1 | 1/2007 | Gk et al. |
| 2007/0045789 A1 | 3/2007 | Clavequin et al. |
| 2012/0159230 A1 | 6/2012 | Chen |
| 2013/0139524 A1* | 6/2013 | Kim ........................ F25B 21/02 |
| | | 62/3.7 |
| 2014/0082402 A1* | 3/2014 | Lee ........................... G06F 1/04 |
| | | 713/501 |
| 2014/0143593 A1 | 5/2014 | Strauss et al. |
| 2015/0003156 A1 | 1/2015 | Berckmann et al. |
| 2015/0067419 A1 | 3/2015 | Raghu et al. |
| 2015/0187442 A1 | 7/2015 | Sivasankaran et al. |
| 2016/0034189 A1* | 2/2016 | Kim ........................ G06F 3/061 |
| | | 711/103 |
| 2016/0117101 A1* | 4/2016 | Choi ....................... G06F 3/061 |
| | | 711/103 |
| 2016/0180898 A1* | 6/2016 | Hwang ................. G11C 7/1063 |
| | | 711/103 |
| 2016/0225436 A1* | 8/2016 | Wang .................... G06F 11/076 |
| 2017/0031845 A1 | 2/2017 | Tzafrir |
| 2017/0053683 A1 | 2/2017 | Lee et al. |
| 2018/0039444 A1* | 2/2018 | Yamamoto .............. G06F 3/067 |
| 2018/0189211 A1 | 7/2018 | Zehavi et al. |
| 2019/0056880 A1 | 2/2019 | Tzafrir et al. |
| 2019/0058474 A1 | 2/2019 | Tzafrir et al. |

OTHER PUBLICATIONS

Tzafrir, Yonatan, "Interface Adjustment Processes for a Data Storage Device," U.S. Appl. No. 14/812,794, filed Jul. 29, 2015, (63 pages).

* cited by examiner

DYNAMIC CALIBRATION OF FREQUENCY AND POWER STORAGE INTERFACE

CROSS-REFERENCE TO RELATED APPLICATIONS

This application is a continuation-in-part of co-pending U.S. patent application Ser. No. 15/679,468, filed on Aug. 17, 2017, which application is herein incorporated by reference.

BACKGROUND OF THE DISCLOSURE

Field of the Disclosure

This disclosure is generally related to data storage devices and more specifically to on the fly adjustment of frequency and voltage of a data storage device.

Description of the Related Art

During operation of a data storage device, data may be communicated between a controller and a memory of the data storage device via a data bus that couples the controller and the memory. For example, one or more data values may be provided to or received from the data bus at a transfer rate based on a frequency of a clock signal. To illustrate, a first data value may be provided to the data bus from the controller in response to a rising edge of the clock signal. As another example, a second data value may be received from the data bus and stored at the controller in response to a falling edge of the clock signal.

A data storage device may be designed to have a fixed clock frequency that allows sufficient setup and hold times to enable reliable transmission and sampling of data over a bus interface between integrated circuits (e.g., a controller and a non-volatile memory). Typically, large margins are provided with respect to the clock frequency to account for worst-case scenarios (e.g., worst-case silicon process speed, system voltage, and system temperature (PVT) conditions) that may occur during operation of the data storage device. Setting the clock frequency (e.g., a data transfer rate) to the fixed value may avoid errors that may occur if the data transfer rate is too high in such worst-case scenarios. However, by operating the data storage device (e.g., the bus) at a clock frequency based on the worst-case scenarios, a data transfer rate (e.g., a bus speed) may be significantly lower than a theoretical maximum data transfer rate of the bus.

Therefore, there is a need in the art for a data storage device that has an adjustable clock frequency.

SUMMARY OF THE DISCLOSURE

The present disclosure generally relates to a data storage device that includes a controller and a memory. The controller includes a host interface and a memory interface. The controller receives inputs from the host, internal storage device inputs, device lifetime calculations, temperature readings and voltage readings. The controller then dynamically adjusts the frequency and voltage for the memory interface based upon the inputs received. As such, the memory interface operates are optimum conditions.

In one embodiment, a method comprises determining initial values of a memory interface of a data storage device, wherein the initial values include a minimum write frequency, a minimum read frequency, a maximum write frequency and a maximum read frequency; receiving an input trigger; adjusting frequency and voltage of the memory interface; calibrating the frequency to obtain a maximum possible frequency for the memory interface; and checking a transmitted pattern across the memory interface for errors.

In another embodiment, a method comprises determining initial values of a memory interface of a data storage device, wherein the initial values include a minimum write frequency, a minimum read frequency, a maximum write frequency and a maximum read frequency; decreasing the frequency of the memory interface; increasing voltage to the memory interface; and repeating the determining, decreasing and increasing while ensuring a number of errors observed remains below a predefined threshold.

In another embodiment, a data storage device comprises one or more memory devices; and a controller coupled to the one or more memory devices. The controller includes: a host interface for coupling the data storage device to a host device; a memory interface for coupling the one or more memory devices to the controller; a voltage regulator; an interface timing adjustment engine; and one or more of: an internal inputs monitor; a host inputs module; a device lifetime monitor; a temperature sensor; and a voltage sensor.

In another embodiment, a data storage device comprises means to receive inputs regarding one or more of the following: internal device inputs, host inputs, device lifetime, temperature, and voltage; means to adjust frequency of a memory interface of the data storage device wherein the means to adjust frequency is coupled to the means to receive inputs; and means to adjust voltage of the memory interface, wherein the means to adjust voltage is coupled to the means to receive inputs.

In another embodiment, a data storage system comprises a host device; and a data storage device coupled to the host device. The data storage device includes one or more memory devices; and a controller coupled to the one or more memory devices, the controller configured to receive inputs from one or more of the following: internal device inputs, host inputs, device lifetime, temperature, and voltage, the controller also configured to adjust frequency and voltage of a memory interface of the data storage device based upon the received inputs.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
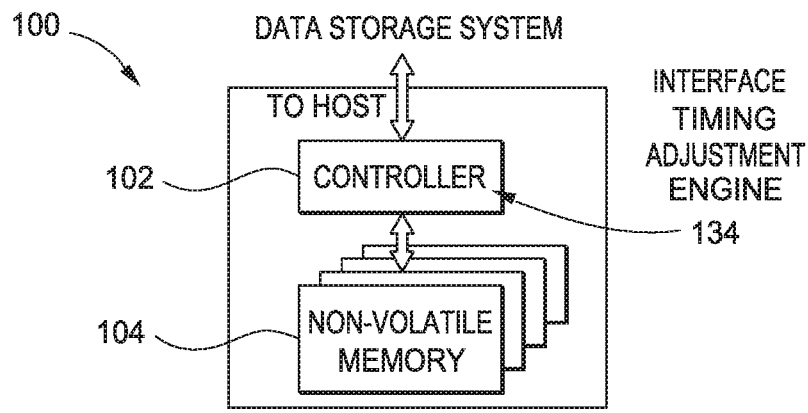
FIG. 1 is a block diagram of an illustrative example of a data storage system including a controller that includes an interface timing adjustment engine.

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "exemplary" may indicate an example, an implementation, and/or an aspect, and should not be construed as limiting or as indicating a preference or a preferred example, implementation, and/or aspect.

The present disclosure describes systems and methods of identifying a risk of a setup/hold violation associated with a data bus interface and adjusting a frequency of a clock signal, based on the identified risk. A data storage device includes a controller and a memory. The controller includes a host interface and a memory interface. The controller performs a first operation on the memory through the memory interface at a first frequency associated with the host interface to determine a first data pattern. The controller performs a read operation on the memory through the memory interface at a second frequency to determine a second data pattern. In response to the first pattern being equal to the second pattern, the controller increases the first frequency by a predetermined amount. In response to the first pattern being not equal to the second pattern, the controller decreases the first frequency by the predetermined amount. Performing the first operation, performing the read operation, and increasing or decreasing the first frequency are repeated until the first frequency is equal to a maximum operating frequency having an associated risk of a setup/hold violation associated that is below a predetermined probability.

By varying the operating frequency by one or more predetermined amounts, a real-time (i.e., "on the fly") measure of a risk of setup and hold time violations are provided. The real-time measure may enable operation of the data bus interface (e.g., a bus) at a "maximal" reliable clock frequency. For example, the "on the fly" monitoring of bus operations may provide a real-time warning of nearing a condition of a setup time violation or a hold time violation. In response to identification of a risk of a setup/hold time violation, the operating frequency may be adjusted to avoid the setup/hold time violation. By adjusting the frequency of the clock signal, the data bus interface can reliably operate with a "maximal" frequency (without setup/hold violations) during different operating conditions that result from changing PVT conditions. Accordingly, the data bus interface may operate at rate that is higher than a rate appropriate for a worst-case scenario, thus improving an overall performance of the data bus interface.

Figure 2:
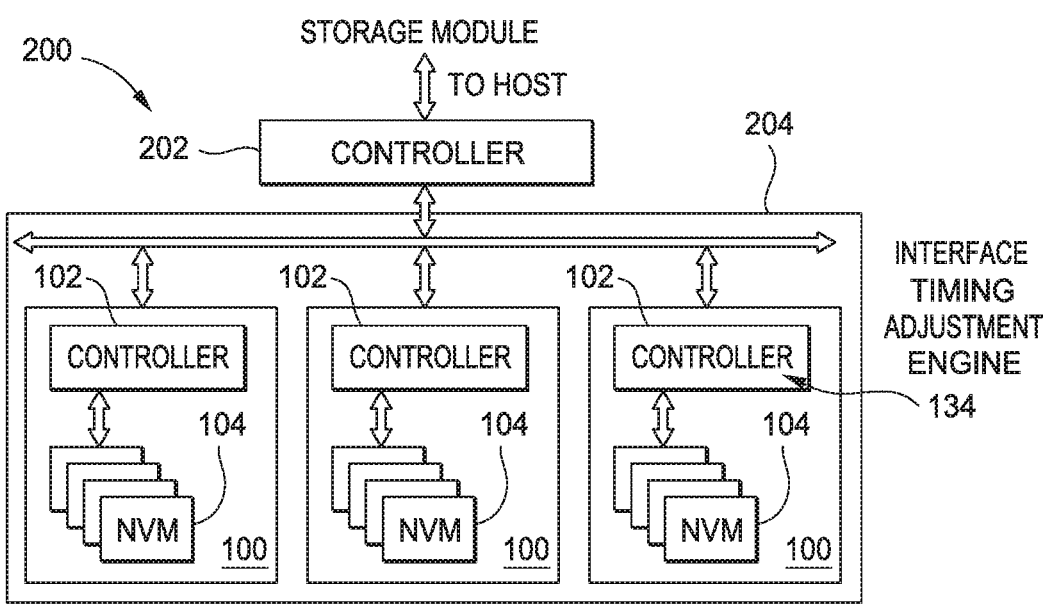
FIG. 2 is a block diagram of an illustrative example of a storage module that includes a plurality of data storage systems that each may include a controller having an interface timing adjustment engine.
Figure 3:
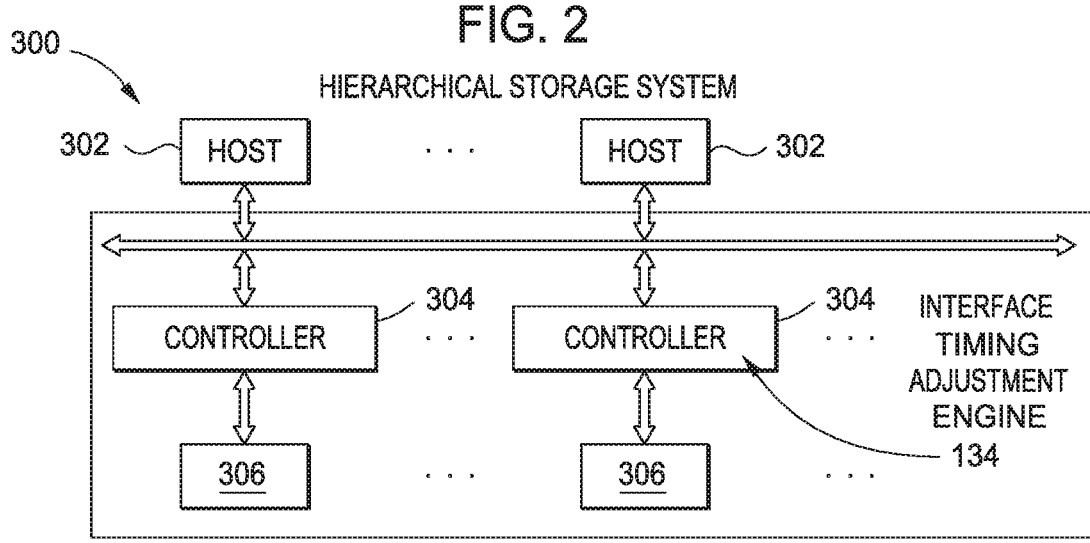
FIG. 3 is a block diagram of an illustrative example of a hierarchical data storage system that includes a plurality of controllers that each may include an interface timing adjustment engine.

Memory systems suitable for use in implementing aspects of the disclosure are shown in FIGS. 1-3. FIG. 1 is a block diagram illustrating a data storage system 100 according to an example of the subject matter described herein. Referring to FIG. 1, the data storage system 100 includes a controller 102 and non-volatile memory that may be made up of one or more non-volatile memory die 104. As used herein, the term "memory die" refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The controller 102 may include an interface timing adjustment engine 134.

The controller 102 (which may be a flash storage controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can be stored external to the controller, and other components can be used. Additionally, the phrase "operatively in communication with" could mean directly in communication with or indirectly (wired or wireless) in communication with through one or more components, which may or may not be shown or described herein.

As used herein, a flash storage controller is a device that manages data stored on flash memory and communicates with a host, such as a computer or electronic device. A flash storage controller can have various functionalities in addition to the specific functionality described herein. For example, the flash storage controller can format the flash memory, map out bad flash memory cells, and allocate spare cells to be substituted for future failed cells. Some part of the spare cells can be used to hold firmware to operate the flash storage controller and implement other features. In operation, when a host is to read data from or write data to the flash memory, the host communicates with the flash storage controller. If the host provides a logical address to which data is to be read/written, the flash storage controller can convert the logical address received from the host to a physical address in the flash memory. (Alternatively, the host can provide the physical address.) The flash storage controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, data storage system 100 may be a card based system, such as a secure digital (SD) or a micro secure digital (micro-SD) card. In an alternate embodiment, data storage system 100 may be part of an embedded memory system.

Although, in the example illustrated in FIG. 1, data storage system 100 includes a single channel between controller 102 and non-volatile memory die 104, the subject matter described herein is not limited to having a single memory channel. For example, in some NAND memory system architectures (such as the ones shown in FIGS. 2 and 3), 2, 4, 8 or more NAND channels may exist between the controller and the NAND memory device, depending on controller capabilities. In any of the embodiments described herein, more than a single channel may exist between the controller 102 and the non-volatile memory die 104, even if a single channel is shown in the drawings.

FIG. 2 illustrates a storage module 200 that includes a plurality of data storage systems 100. As such, storage module 200 may include a controller 202 that interfaces with a host and with storage system 204. The storage module 200 includes a plurality of data storage systems 100. The interface between controller 202 and data storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers. Each controller 102 of FIG. 2 may include an interface timing adjustment engine corresponding to the interface timing adjustment engine 134. Alternatively or in addition, the controller 202 may include an interface timing adjustment engine corresponding to the interface timing adjustment engine 134.

FIG. 3 is a block diagram illustrating a hierarchical storage system 300. A hierarchical storage system 300 includes a plurality of controllers 304, each of which controls a respective storage system 306. Controllers 304 may access memories within the hierarchical storage system 300 via a bus interface. In one embodiment, the bus interface may be an NVMe or fiber channel over Ethernet (FCoE) interface. In one embodiment, the hierarchical storage system 300 illustrated in FIG. 3 may be a rack mountable mass storage system that is accessible by multiple host computers 302, such as would be found in a data center or other location where mass storage is needed. Each controller 202 of FIG. 2 may include an interface timing adjustment engine corresponding to the interface timing adjustment engine 134.

Figure 4:
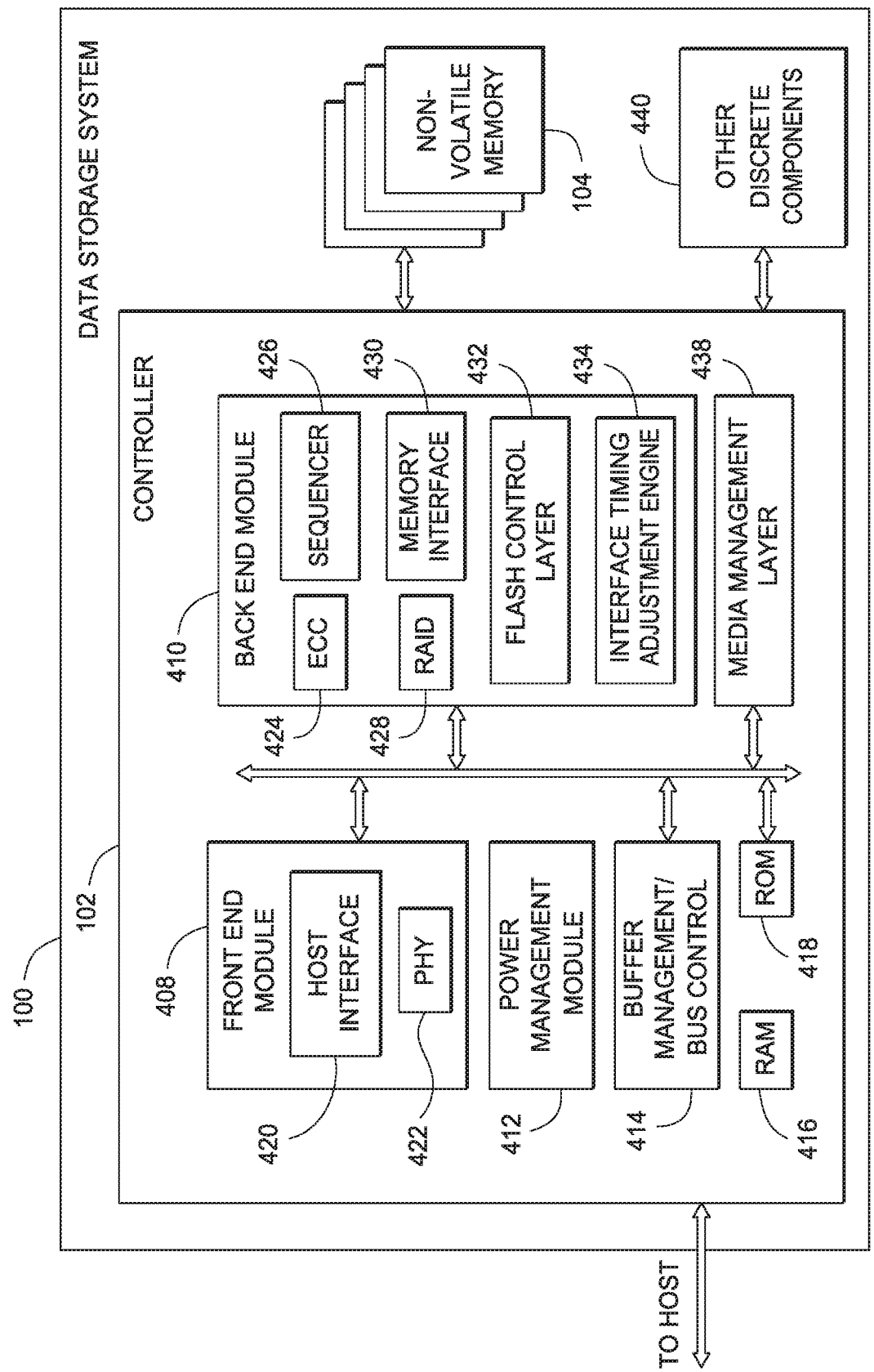
FIG. 4 is a block diagram illustrating an example of a data storage system including a controller that may include an interface timing adjustment engine.

FIG. 4 is a block diagram illustrating exemplary components of controller 102 in more detail. Controller 102 includes a front end module 408 that interfaces with a host, a back end module 410 that interfaces with the one or more non-volatile memory die 104, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 414 manages buffers in random access memory (RAM) 416 and controls the internal bus arbitration of the controller 102. A read only memory (ROM) 418 stores system boot code. Although illustrated in FIG. 4 as located within the controller 102, in other embodiments one or both of the RAM 416 and the ROM 418 may be located externally to the controller 102. In yet other embodiments, portions of RAM and ROM may be located both within the controller 102 and outside the controller 102.

Front end module 408 includes a host interface 420 and a physical layer interface (PHY) 422 that provide the electrical interface with the host or next level controller. The choice of the type of host interface 420 can depend on the type of memory being used. Examples of host interfaces 420 include, but are not limited to, SATA, SATA Express, SAS, Fibre Channel, USB, PCIe, and NVMe. The host interface 120 typically facilitates transfer for data, control signals, and timing signals.

Back end module 410 includes an error correction code (ECC) engine 424 that encodes the data received from the host, and decodes and error corrects the data read from the non-volatile memory. A command sequencer 426 generates command sequences, such as program and erase command sequences, to be transmitted to non-volatile memory die 104. A RAID (Redundant Array of Independent Drives) module 428 manages generation of RAID parity and recovery of failed data. The RAID parity may be used as an additional level of integrity protection for the data being written into the non-volatile memory die 104. In some cases, the RAID module 428 may be a part of the ECC engine 424. A memory interface 430 provides the command sequences to non-volatile memory die 104 and receives status information from non-volatile memory die 104. For example, the memory interface 430 may be a double data rate (DDR) interface, such as a Toggle Mode 200, 400, or 800 interface. A flash control layer 432 controls the overall operation of back end module 410. The back end module 410 may also include the interface timing adjustment engine 434.

Additional components of data storage system 100 illustrated in FIG. 4 include a power management module 412 and a media management layer 438, which performs wear leveling of memory cells of non-volatile memory die 104. Data storage system 100 also includes other discrete components 440, such as external electrical interfaces, external RAM, resistors, capacitors, or other components that may interface with controller 102. In alternative embodiments, one or more of the physical layer interface 422, RAID module 128, media management layer 138 and buffer management/bus controller 114 are optional components that are omitted from the controller 102.

Figure 5:
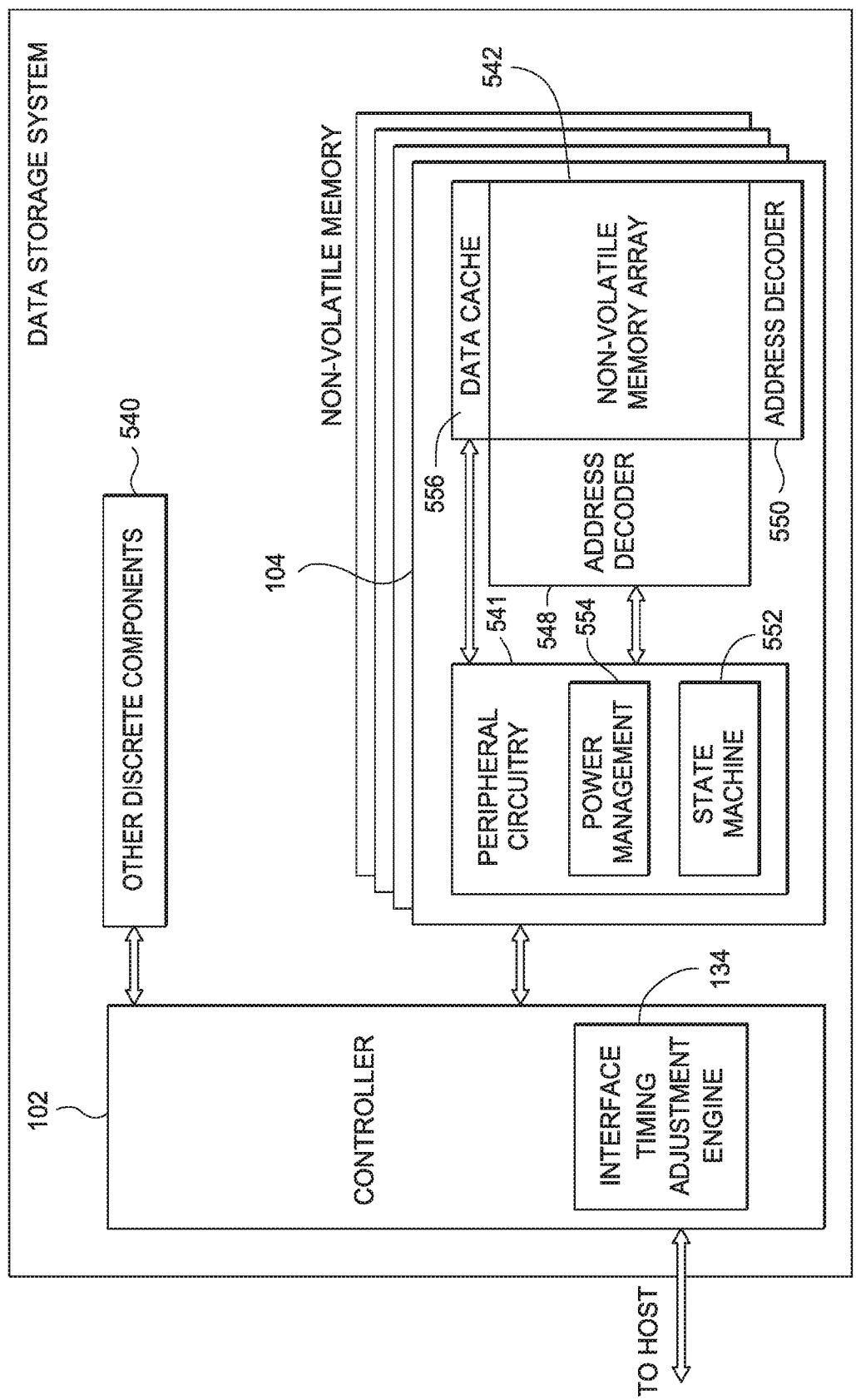
FIG. 5 is a block diagram illustrating exemplary components of a non-volatile memory die that may be coupled to a controller that includes an interface timing adjustment engine.

FIG. 5 is a block diagram illustrating exemplary components of non-volatile memory die 104 in more detail. Non-volatile memory die 104 includes peripheral circuitry 541 and non-volatile memory array 542. Non-volatile memory array 542 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 541 includes a state machine 552 that provides status information to controller 102, which may include the interface timing adjustment engine 134. The peripheral circuitry 541 may also include a power management or data latch control module 554. Non-volatile memory die 104 further includes discrete components 540, an address decoder 548, an address decoder 550, and a data cache 556 that caches data.

Figure 6:
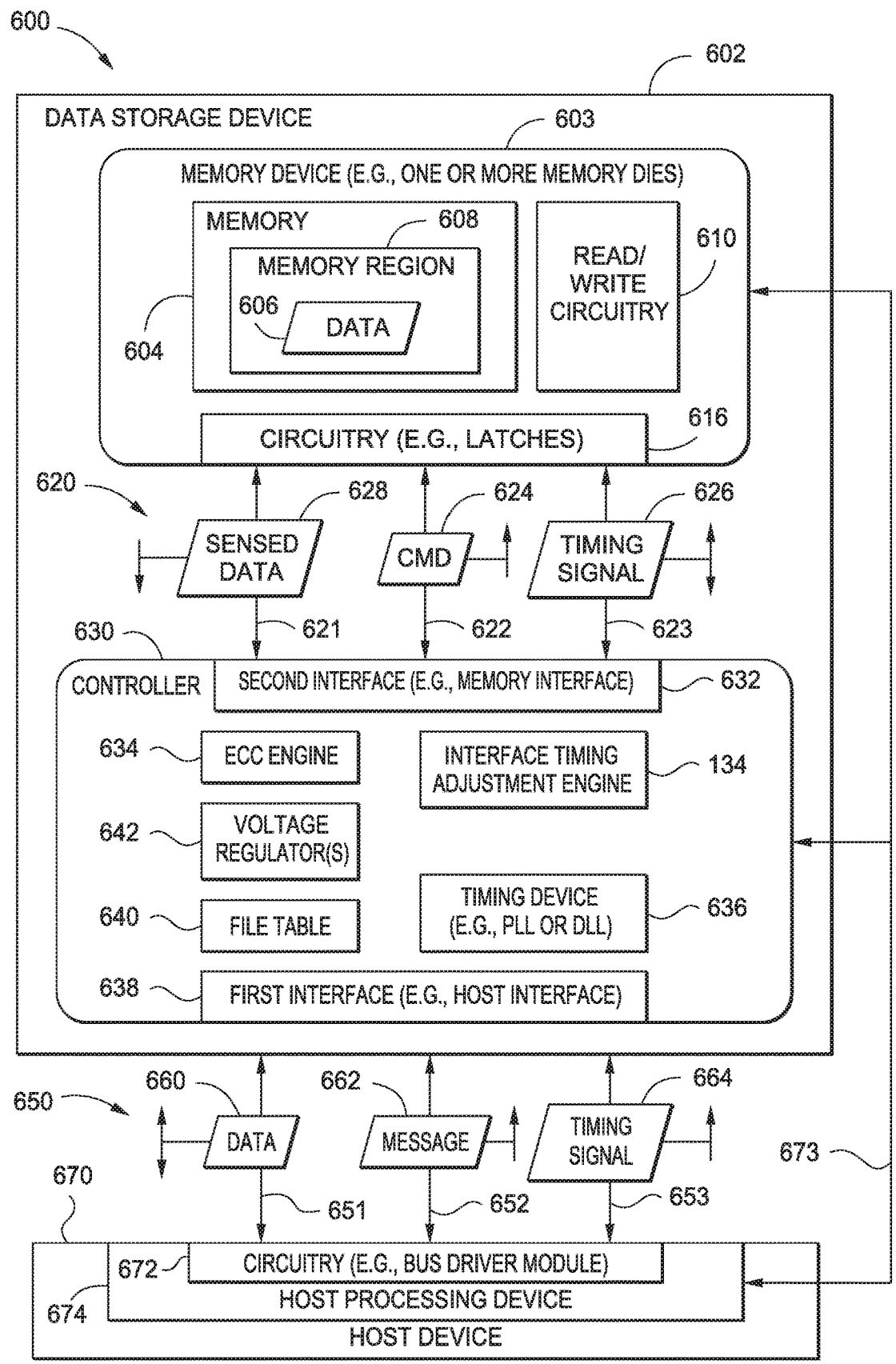
FIG. 6 is a block diagram of a particular illustrative example of a data storage system including a data storage device that includes an interface timing adjustment engine.

FIG. 6 depicts an illustrative example of a data storage system 600. The data storage system 600 includes a data storage device 602 (e.g., the data storage system 100) and a host device 670 (e.g., the host 302).

The data storage device 602 may include a memory device, such as a memory device 603. The memory device 603 may include one or more memory dies (e.g., one memory die, two memory dies, eight memory dies, or another number of memory dies). To further illustrate, the memory device 603 may include the non-volatile memory die 104. The memory device 603 includes a memory 604, such as a non-volatile memory of storage elements included in a memory die of the memory device 603. For example, the memory 604 may include a flash memory, such as a NAND flash memory, or a resistive memory, such as a resistive random access memory (ReRAM), as illustrative examples. The memory 604 may have a three-dimensional (3D) memory configuration. As an example, the memory 604 may have a 3D vertical bit line (VBL) configuration. In a particular implementation, the memory 604 is a non-volatile memory having a 3D memory configuration that is monolithically formed in one or more physical levels of arrays of memory cells having an active area disposed above a silicon substrate. Alternatively, the memory 604 may have another configuration, such as a two-dimensional (2D) memory configuration or a non-monolithic 3D memory configuration (e.g., a stacked die 3D memory configuration).

The memory 604 may include one or more regions of storage elements (also referred to herein as memory cells), such as a memory region 608. An example of a memory region is a block, such as a NAND flash erase group of memory elements. Another example of a memory region 608 is a word line of memory elements. A word line may function as a single-level-cell (SLC) word line or as a multi-level-cell (MLC) word line (such as a three-bit-per-cell word line or a two-bit-per-cell word line, as illustrative examples). Each memory element of the memory 604 may be programmable to a state (e.g., a threshold voltage in a flash configuration or a resistive state in a resistive memory configuration) that indicates one or more bit values.

The memory device 603 further includes read/write circuitry 610. The read/write circuitry 610 is configured to program values to storage elements of the memory 604 and to sense values from memory elements of the memory 604. The memory device 603 may further include circuitry 616 (e.g., one or more data latches, one or more control latches, or a combination thereof).

The data storage device 602 may further include a controller 630. The controller 630 may include a first interface 638 (e.g., a host interface), an error correction code (ECC) engine 634, a timing device 636, a second interface 632 (e.g., a memory interface), and one or more voltage regulators 642. For example, the ECC engine 634 may correspond to the ECC engine 424, the first interface 638 may correspond to the host interface 420, and the second interface 632 may correspond to the memory interface 430. To further illustrate, the first interface 638 may include one or more latches to receive data and commands from the host device 670, and the second interface 632 may include one or more bus drivers to send data and commands to the circuitry 616 of the memory device 603. The controller 630 may store (or access) a file table 640, such as a file allocation table (FAT). The controller 630 also includes the interface timing adjustment engine 134.

The host device 670 may include circuitry 672. For example, the circuitry 672 may include one or more bus drivers. The circuitry 672 may be integrated within or coupled to a processor or controller of the host device 670, such as within a host processing device 674 (e.g., an application processor).

The data storage device 602 and the host processing device 674 are coupled via a connection 650 (e.g., a bus). For example, FIG. 6 illustrates that the connection 650 may include one or more data lines 651, one or more control lines 652, and one or more timing signal lines 653. The connection 650 is coupled to the first interface 638 and to the circuitry 672. In some implementations, the connection 650 may include or may be coupled to the physical layer interface 422 of FIG. 4.

The memory device 603 and the controller 630 are coupled via a connection 620 (e.g., a bus). For example, FIG. 6 illustrates that the connection 620 may include one or more data lines 621, one or more control lines 622, and one or more timing signal lines 623. The connection 620 is coupled to the circuitry 616 and to the second interface 632.

In an illustrative implementation, the data storage system 600 further includes a power supply connection 673 (e.g., a "rail" to provide a power supply voltage, such as VDD, VCC, or both). The power supply connection 673 may be coupled to the memory device 603, the controller 630, and the host processing device 674. Depending on the particular implementation, the power supply connection 673 may be supplied by a battery (e.g., a mobile device battery) or by a power supply device (e.g., a transformer) coupled to a main power supply. In other implementations, the memory device 603, the controller 630, and/or the host processing device 674 are connected to separate power supply connections.

During operation, the controller 630 is configured to receive data and instructions from the host device 670 using the first interface 638. For example, the controller 630 may receive data 660 from the host device 670 via the first interface 638. To further illustrate, the data 660 may be received via the one or more data lines 651 in connection with a request for write access sent via the one or more control lines 652. The data 660 and the request may be received by the controller 630 based on a timing signal 664 (e.g., one or more clock signals, one or more strobe signals, or one or more read enable signals) received via the one or more timing signal lines 653. For example, the first interface 638 may include one or more latches to receive the data 360 based on the timing signal 664. Although FIG. 6 illustrates a single timing signal 664, it should be appreciated that more than one timing signal 664 may be used (e.g., a differential pair of timing signals).

The ECC engine 634 may be configured to receive the data 660 and to generate one or more ECC codewords based on the data 660. The ECC engine 634 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The controller 630 is configured to send data and commands to the memory device 603 using the second interface 632 and to receive data from the memory device 603 using the second interface 632. For example, the controller 630 is configured to send data (e.g., one or more ECC codewords generated by the ECC engine 634) and a write command (e.g., a command 624) to cause the memory device 603 to store the data to a specified address of the memory 604. The write command may specify a physical address of a portion of the memory 604 that is to store the data. To further illustrate, the controller 630 may send the data to the memory device 603 via the one or more data lines 621 in connection with a write command sent via the one or more control lines 622. The memory device 603 may receive the data and the write command based on a timing signal 626 (e.g., one or more clock signals or one or more strobe signals) provided by the controller 630 via the one or more timing signal lines 623. For example, the circuitry 616 may include one or more latches configured to receive the data 660 based on the timing signal 664. The memory device 603 may cause the read/write circuitry to write the data to the memory 604 based on the timing signal 626. Although FIG. 6 illustrates a single timing signal 626, it should be appreciated that more than one timing signal 626 may be used (e.g., a differential pair of timing signals). Further, in some cases, the timing signal 626 may include a signal generated by the memory device 603, such as a read enable signal.

The controller 630 is configured to send a read command (e.g., the command 624) to the memory device 603 to access data from a specified address of the memory 604. For example, the controller 630 may send the read command to the memory device 603 in response to receiving a request for read access from the host device 670. The read command may specify the physical address of a portion of the memory 604. For example, the read command may specify the physical address of a portion of the memory 604 storing the data. In response to the read command, the memory device 603 may cause the read/write circuitry 610 to sense the portion of the memory 604 storing the data to generate sensed data (e.g., a representation of the data that may differ with respect to the data due to one or more bit errors).

The controller 630 is configured to receive the sensed data from the memory device 603 via the second interface 632. The controller 630 may input the sensed data to the ECC engine 634 to initiate a decoding process to correct one or more bit errors in the sensed data (if any) up to a particular error correction capability of the particular ECC technique. The ECC engine 634 may include a Hamming decoder, an RS decoder, a BCH decoder, an LDPC decoder, a turbo decoder, a decoder configured to decode data according to one or more other ECC schemes, or a combination thereof.

In response to decoding the sensed data, the ECC engine 634 may output the data 660. The controller 630 may provide the data 660 to the host device 670 using the first interface 638.

The host device 670 may periodically or occasionally initiate an adjustment process (e.g., a frequency calibration or "tuning" process) associated with the first interface 638. For example, the adjustment process may include adjusting the timing signal 664 (e.g., by adjusting frequency of the timing signal 664). During the adjustment process, the host device 670 may send (e.g., using the circuitry 672) data (e.g., the data 660) to the controller 630. The controller 630 may receive the data using the first interface 638, such as using one or more latches of the first interface 638. Alternatively or in addition, the adjustment process may include receiving data (e.g., the data 660) from the controller 630 by the host device 670.

In some implementations, the host device 670 initiates the adjustment process in response to a power-on event at the data storage system 600. Alternatively or in addition, the host device 670 may initiate the adjustment process in response to one or more other events, such as an error in connection with a request for read access or a request for write access (e.g., due to a temperature change or a voltage change at the data storage system 600) and/or during an idle time associated with the data storage device 602 (e.g., if the host device 670 is not requesting read access or write access).

Prior to the host device 670 initiating the adjustment process, the controller 630 may receive a message 662 specifying that the host device 670 is to perform the adjustment process. For example, FIG. 6 illustrates that the controller 630 may receive the message 662 via the one or more control lines 652. In other implementations, the controller 630 may receive the message 662 via another technique (e.g., via the one or more data lines 651, or via a dedicated bus or connection, as illustrative examples).

In some implementations, the message 662 complies with an interface protocol, such as an interface protocol in accordance with an industry standard. For example, the first interface 638 may comply with a MultiMedia Card (MMC) standard, such as an embedded MultiMedia Card (eMMC) standard. In this case, the message 662 may include a command that complies with an MMC or eMMC standard. As another example, the first interface 638 may comply with a Serial Advanced Technology Attachment (SATA) standard, and the message 662 may include a command that complies with the SATA standard. As an additional example, the first interface 638 may comply with a Universal Serial Bus (USB) standard, and the message 662 may include a command that complies with the USB standard.

The controller 630 is configured to initiate the adjustment process (e.g., an operating frequency calibration or "tuning" process) associated with the second interface 632 in response to the message 662. For example, the interface timing adjustment engine 134 may be configured to adjust the timing signal 626 (e.g., by adjusting a frequency of the timing signal 626). In an illustrative implementation, the interface timing adjustment engine 134 initiates the adjustment process in response to receiving the message 662 to enable the data storage device 602 to perform the adjustment process.

To further illustrate, certain examples of operations that may be performed during the adjustment process are described below. It should be appreciated that the examples are illustrative and that the scope of the disclosure is not limited to the described examples. To illustrate, one or more operations of one of the examples below may be combined with one or more operations of another of the examples without departing from the scope of the disclosure. Those of skill in the art will recognize that other modifications of the described examples are within the scope of the disclosure.

The adjustment process may include one or more of writing data to the memory 604 or reading data from the memory 604. To illustrate, in response to receiving the message 662, the interface timing adjustment engine 134 may cause the second interface 632 to send data 606 and a write command (e.g., the command 624) to the circuitry 616 using the connection 620. The write command may specify one or more physical addresses of the memory 604, such as a physical address of the memory region 608. Upon receiving the data 606 at the circuitry 616, the memory device 603 may cause the read/write circuitry 610 to program the data 606 to the memory 604. In response to programming the data 606 to the memory 604, the memory device 603 may send a status indication to the controller 630 indicating a status of the write operation (e.g., a pass or fail status).

In some implementations, the data 606 may include "dummy" data (e.g., a predetermined set of bits or a pseudo-randomly generated set of bits). In this case, the controller 630 may be configured to update the file table 640 to indicate that the data 606 is invalid (e.g., after receiving the status indication from the memory device 603 indicating a pass status of the write operation). In other cases, the data 606 may include user data. In this case, the controller 630 may be configured update the file table 640 to indicate that the data 606 is valid (e.g., after receiving the status indication from the memory device 603 indicating a pass status of the write operation).

Alternatively or in addition to writing data to the memory 604, the adjustment process may include reading data from the memory 604 and receiving the data at the controller 630 using the second interface 632. For example, the controller 630 may send a read command (e.g., the command 624) to the memory device 603 using the connection 620. The read command may specify the physical address of the memory region 608. The memory device 603 may cause the read/write circuitry 610 to sense the memory region 608 to generate sensed data 628. The memory device 603 may provide the sensed data 628 to the controller 630 using the connection 620, and the controller 630 may receive the sensed data 628 using the second interface 632.

Alternatively or in addition to writing data to the memory 604 and/or reading data from the memory 604, the adjustment process may include erasing data at the memory 604. For example, the controller 630 may send an erase command (e.g., the command 624) to the memory device 603 using the connection 620. The erase command may specify a physical address of a storage region. To illustrate, if erase command specifies the physical address of the memory region 608, the memory device 603 may cause the read/write circuitry 610 to erase the data 606 from the memory region 608. After erasing the data 606, the controller 630 may be configured to update the file table 640 to indicate that the memory region 608 is available for write operations. In some cases, the controller 630 is configured to rewrite the data 606 during the adjustment process (such as if the data 606 includes valid user data). In other cases, the controller 630 may not rewrite the data 606 during the adjustment process (e.g., if the data 606 is "dummy" data).

In some implementations, the controller 630 is configured to randomly or pseudo-randomly select the memory region 608. For example, the controller 630 may be configured to pseudo-randomly select one or more physical addresses storing valid data by accessing the file table 640. In this example, the controller 630 may be configured to pseudo-randomly select a physical address of the memory region 608 from the file table 640 in response to receiving the message 662 and to write or read data based on the selected physical address. Depending on the particular implementation, the controller 630 may select between physical addresses of the memory 604 storing valid data, physical addresses of the memory 604 storing invalid data, or both.

In another example, the memory region 608 may include a "dedicated" storage area that is reserved for operations performed during the second adjustment process. For example, the memory region 608 may include a memory area that has been closed to write operations (e.g., due to a malfunction, a defect, or a high number of program/erase cycles). In this case, the data 606 may include dummy data (instead of user data).

In some implementations, the ECC engine 634 may perform one or more ECC operations (e.g., encoding operations and/or decoding operations) during the second adjustment process. To illustrate, in some implementations, the ECC engine 634 may encode data to generate the data 606 during the second adjustment process. Alternatively or in addition, the ECC engine 634 may decode the sensed data 628 to generate decoded data during the second adjustment process. In an illustrative implementation, the ECC engine 634 performs ECC operations in response to the controller 630 sending or receiving data at the connection 620 during the adjustment process.

In some implementations, the controller 630 may send data to and receive data from one or more latches of the circuitry 616 without causing the memory device 603 to program the data to and sense the data from the memory 604. For example, the controller 630 may be configured to send the data 606 and a command (e.g., the command 624) to the circuitry 616 using the connection 620. In some implementations, the command 624 indicates that the memory device 603 is to "hold" the data 606 in one or more latches of the circuitry 616 (e.g., without programming the data 606 to the memory 604). The controller 630 may retrieve the data 606 from one or more latches of the circuitry 616 via the connection 620 during the adjustment process. Thus, in some implementations the adjustment process includes latch-based operations (e.g., does not include writing data to or reading data from the memory 604), and in some implementations the adjustment process includes memory-based operations (e.g., by writing data to and/or reading data from the memory 604 during the adjustment process).

Depending on the particular application, a latch-based adjustment process may generate more noise at the connection 620 as compared to a memory-based adjustment process. For example, if data is not written to and/or read from the memory 604 during the adjustment process, the connection 620 may remain charged during the second process (e.g., due to a capacitive effect associated with values stored in one or more latches of the circuitry 616). A latch-based adjustment process may be advantageous in applications where the connection 650 is sensitive to noise generated at the connection 620 (e.g., if the connection 650 is located near the connection 620). In some cases, a memory-based adjustment process may generate more noise at the power supply connection 673 as compared to a latch-based adjustment process. For example, use of programming voltages and/or read voltages during programming and/or read operations may generate noise at the power supply connection 673. A memory-based adjustment process may be advantageous in applications where one or both of the connections 620 are sensitive to power supply noise (e.g., if one or both of the connections 620 are sensitive to "glitches" in a supply voltage provided by the power supply connection 673, such as glitches that are due to capacitance and/or inductance that may be associated with the power supply connection 673).

Alternatively or in addition to latch-based operations and memory-based operations, the adjustment process may include ECC-based operations (e.g., by performing one or more encoding operations and/or one or more decoding operations at the ECC engine 634 during the adjustment process). In some applications, operation of the ECC engine 634 during the adjustment process may affect operation of the connection 650, such as by generating noise at the power supply connection 673 that affects the connection 650. In an illustrative implementation, the adjustment process may be performed in accordance with a "full power" mode during which data is encoded, sent to the circuitry 616, written to the memory 604, sensed from the memory 604, provided to the second interface 632, and decoded by the ECC engine 634. A "full power" mode may be advantageous if the adjustment process is to provide a "worst case" amount of noise and/or power consumption. For example, certain operations (such as the "full power" mode) may cause a "peak" power usage that temporarily reduces a level of a supply voltage provided by the power supply connection 673. In this case, performance of one or more interface drivers may be temporarily reduced, resulting in a "worst case" operating condition.

In some cases, the data storage device 602 may "extend" the adjustment process (e.g., by repeating the adjustment process one or more times or by performing one or more other operations). To illustrate, the host device 670 may indicate termination of the adjustment process either directly (e.g., using a particular command) or indirectly (e.g., by ceasing to use the connection 650 or by sending a read command or a write command to the data storage device 602). In some implementations, the data storage device 602 is configured to "extend" the adjustment process until the host device 670 indicates termination of the adjustment process.

In some cases, the adjustment process may include performing one or more operations specified by the host device 670. For example, the message 662 may indicate one or more types of operations to be performed during the adjustment process (e.g., one or more write operations, one or more read operations, one or more encoding operations, one or more decoding operations, one or more other operations, or a combination thereof), a number of operations to be performed during the adjustment process, a duration of the adjustment process, or a combination thereof. To further illustrate, in some cases the message 662 may include a field (e.g., a bit) indicating whether the data storage device 602 is to perform the adjustment process in accordance with the "full power" mode. For example, if the data storage system 600 is implemented as a battery-powered device (e.g., a mobile device or a laptop device, as illustrative examples), the field may indicate use of the "full power" mode based on an amount of battery charge satisfying a threshold and/or if the data storage system 600 is currently connected to a main power supply for charging of the battery. It is noted that the disclosure is not limited to these examples and that the system data storage system 600 may be implemented as another device (e.g., a server, a cloud storage device, or a desktop computer, as illustrative examples).

The adjustment process may further include adjusting a frequency of the timing signal 626. For example, the interface timing adjustment engine 134 may be configured to adjust the frequency of the timing signal 626 in connection with the adjustment process during one or more of the foregoing operations. In an illustrative implementation, the interface timing adjustment engine 134 is configured to perform a first operation on the memory 604 through the second interface 632 at a first frequency of the timing signal 626 associated with the second interface 632 to determine a first data pattern stored in circuitry 616 (e.g., in the data latches). The interface timing adjustment engine 134 performs a read operation on the memory 604 through the second interface 632 at a second frequency of the timing signal 626 to determine a second data pattern stored in circuitry 616 (e.g., in the data latches). In an embodiment, the adjustment process to adjust the frequency of the timing signal 626 may occur during an idle time of the second interface 632 or a predetermined amount of time after the completion of the controller 630 servicing an interrupt.

In an embodiment, the second frequency is a relaxed frequency that is lower than a maximum operating frequency. In an embodiment, the first operation is a write operation. In an embodiment, the first operation is a read operation.

In response to the interface timing adjustment engine 134 determining that the first pattern equal to the second pattern, the interface timing adjustment engine 134 increases the first frequency of the timing signal 626 by a predetermined amount. In response to the interface timing adjustment engine 134 determining that the first pattern is not equal to the second pattern, the interface timing adjustment engine 134 decreases the first frequency by the predetermined amount. The performing a first operation, the read operation, and increasing or decreasing the first frequency are repeated until the first frequency is equal to a maximum operating frequency having an associated risk of a setup/hold violation that is below a predetermined probability.

In an embodiment, the predetermined amount is based on a setup and hold time required by the read operation. The predetermined amount is based on at least one of a change in operating voltage, operating temperature, or load of the second interface 632. In an embodiment, the first pattern not being equal to the second pattern and the setup and hold time determines a maximum frequency of operation of the second interface 632.

In an illustrative implementation, the controller 630 includes an exclusive-or (XOR) device configured to perform a set of XOR operations using first sensed data of the first data pattern and the second data pattern and the copy of the data 606 of the first data pattern and the second data pattern to determine a number of errors in the first data pattern and the second data pattern.

In some implementations, the adjustment process may include adjusting a voltage level (e.g., "drive strength") of one or more signals. For example, during the adjustment process, the interface timing adjustment engine 134 may adjust a voltage level of a voltage used at the connection 620, such as by adjusting operation of the one or more voltage regulators 642 (e.g., by selectively activating or deactivating one or more voltage divider devices included in the one or more voltage regulators 642). Adjusting the drive strength may modify a rise time or a fall time associated with a signal. Further, although FIG. 6 illustrates that the one or more voltage regulators 642 are included in the controller 630, it should be appreciated that one or more voltage regulators may be included in the memory device 603 alternatively or in addition to the controller 630.

After performing the adjustment process, the data storage device 602 may continue operation (e.g., by responding to requests for read access or write access from the host device 670). For example, the controller 630 may send data to and receive data from the memory device 603 using the adjusted frequency of the timing signal 626 determined during the adjustment process. The controller 630 may subsequently initiate one or more additional adjustment processes, such as in response to an error at the second interface 632 or in response to receiving another message from the host device 670 specifying that another adjustment process is to be performed.

The examples described with reference to FIG. 6 may enable the adjustment process performed by the host device 670 to compensate for effects on the connection 650 that are due to operations at the connection 620 (and vice versa), resulting in more accurate frequency adjustment of the timing signal 664 (and more accurate frequency adjustment of the timing signal 626). Operation of the data storage system 600 is therefore improved as compared to a conventional device that uses separate (or "non-overlapping") adjustment processes (e.g., due to fewer errors and/or due to less frequent adjustment processes at the data storage system 600 after the adjustment processes are completed).

As described with reference to FIG. 6, "on the fly" monitoring of the bus operations may provide a real-time warning of nearing a condition of a hold time violation. The real-time measure may enable operation of the second interface 632 (and a corresponding bus) at a "maximal" reliable clock frequency. In response to identification of a risk of a hold violation, the controller 630 may adjust a frequency of the clock signal Clk to avoid the hold time violation. By adjusting frequency, the second interface 632 can reliably operate with a "maximal" frequency during different operating conditions that result from changing PVT conditions. Accordingly, the second interface 632 may operate at rate that is higher than a worst-case scenario rate, thus improving an overall performance of the second interface 632.

A particular illustrative example of a method of adjusting a frequency of a clock signal based on write operations is described hereinbelow. The method may be performed by the interface timing adjustment engine 134 of the controller 630 of FIG. 6. An interface timing adjustment engine 134 sets a default write clock frequency of the timing signal 626 associated with the second interface 632. The interface timing adjustment engine 134 waits for a completion of an interrupt service routine of an interrupt according to an interrupt timer. If an interrupt timer has expired, and the interface timing adjustment engine 134 determines that the data storage system 600 has entered an idle mode, then the interface timing adjustment engine 134 writes a write data pattern stored in circuitry 616 (e.g., in the data latches). The interface timing adjustment engine 134 reads a read data pattern stored in circuitry 616 at a relaxed safe frequency that is below the default write clock frequency. The interface timing adjustment engine 134 compares the first data pattern to the second data pattern. If the write data pattern is equal to the read data pattern, then the interface timing adjustment engine 134 increases the clock frequency by a predetermined amount, otherwise, the interface timing adjustment engine 134 decreases the clock frequency by the predetermined amount. Processing returns in either case to writing a data pattern stored in circuitry 616 after entering idle mode.

A particular illustrative example of a method of adjusting a frequency of a clock signal based on read operations is described hereinbelow. The method may be performed by the interface timing adjustment engine 134 of the controller 630 of FIG. 6. The interface timing adjustment engine 134 sets a default read clock frequency of the timing signal 626 associated with the second interface 632. The interface timing adjustment engine 134 waits for a completion of an interrupt service routine of an interrupt according to an interrupt timer. If an interrupt timer has expired, and the control circuitry determines that the data storage system 600 has entered an idle mode, then the interface timing adjustment engine 134 reads a reads read data pattern at a relaxed safe frequency that is below the default read clock frequency. The interface timing adjustment engine 134 reads a second read data pattern stored in circuitry 616 at the clock frequency. The interface timing adjustment engine 134 compares the first read data pattern to the second read data pattern. If the first read data pattern is equal to the second read data pattern, then the interface timing adjustment engine 134 increases the clock frequency by a predetermined amount, otherwise, the interface timing adjustment engine 134 decreases the clock frequency by the predetermined amount. Processing returns in either case to writing a data pattern stored in circuitry 616 after entering idle mode.

Figure 7:
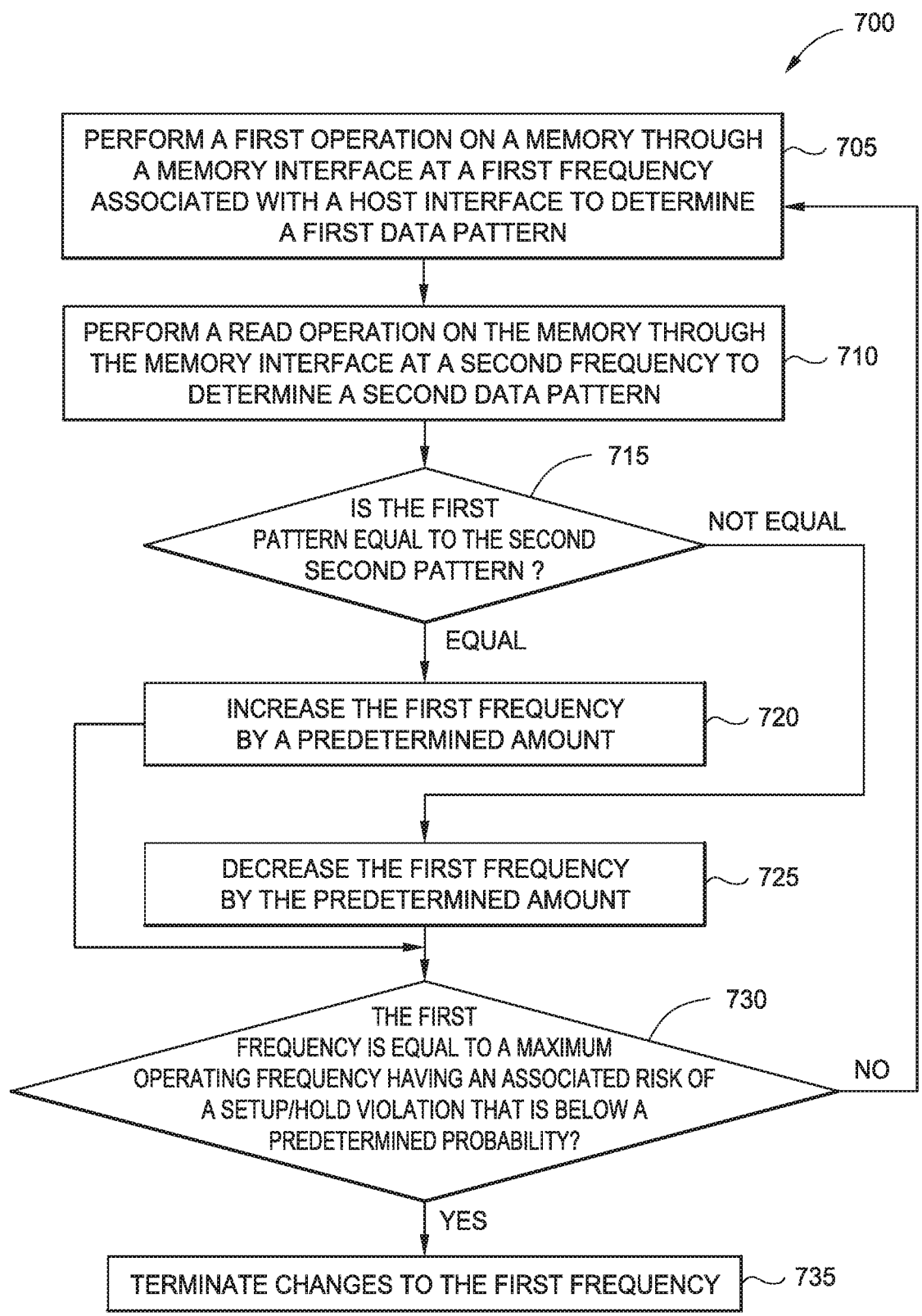
FIG. 7 is a flowchart of an illustrative example of a method of adjusting a frequency parameter of an interface bus.

Referring to FIG. 7, a particular illustrative example of a method of adjusting a frequency parameter associated with a bus speed is depicted and generally designated 700. The method 700 may be performed by the interface timing adjustment engine 134 of the controller 630 of FIG. 6. In an illustrative implementation, at block 705, the interface timing adjustment engine 134 performs a first operation on the memory 604 through the second interface 632 at a first frequency of the timing signal 626 associated with the second interface 632 to determine a first data pattern stored in circuitry 616 (e.g., in the data latches). At block 710, the interface timing adjustment engine 134 performs a read operation on the memory 604 through the second interface 632 at a second frequency of the timing signal 626 to determine a second data pattern stored in circuitry 616 (e.g., in the data latches). In an embodiment, the adjustment process to adjust the frequency of the timing signal 626 may occur during an idle time of the second interface 632 or a predetermined amount of time after the completion of the controller 630 servicing an interrupt.

In an embodiment, the second frequency is a relaxed frequency that is lower than a maximum operating frequency. In an embodiment, the first operation is a write operation. In an embodiment, the first operation is a read operation.

If, at block 715, the interface timing adjustment engine 134 determines that the first pattern is equal to the second pattern, then at block 720, the interface timing adjustment engine 134 increases the first frequency of the timing signal 626 by a predetermined amount. If, at block 715, the interface timing adjustment engine 134 determining that the first pattern is not equal to the second pattern, then at block 725, the interface timing adjustment engine 134 decreases the first frequency by the predetermined amount. If, at block 730, the interface timing adjustment engine 134 determines that the first frequency is equal to a maximum operating frequency having an associated risk of a setup/hold violation associated with the second interface 632 that is below a predetermined probability, then at block 735, changes to the first frequency are terminated; otherwise, the method proceeds back to block 905.

In an embodiment, the predetermined amount is based on a setup and hold time required by the read operation. The predetermined amount is based on at least one of a change in operating voltage, operating temperature, or load of the second interface 632. In an embodiment, the first pattern not being equal to the second pattern and the setup and hold time determines a maximum frequency of operation of the second interface 632.

By adjusting an operating parameter based on the first output and the second output, "on the fly" (e.g., real-time) adjustments may be made to avoid setup/hold violations during operation of an interface. Additionally, by adjusting one or more parameters, such as the frequency of the clock signal Clk, an interface can reliably operate with a maximal frequency during different operating conditions that result from changing PVT conditions.

Figure 8:
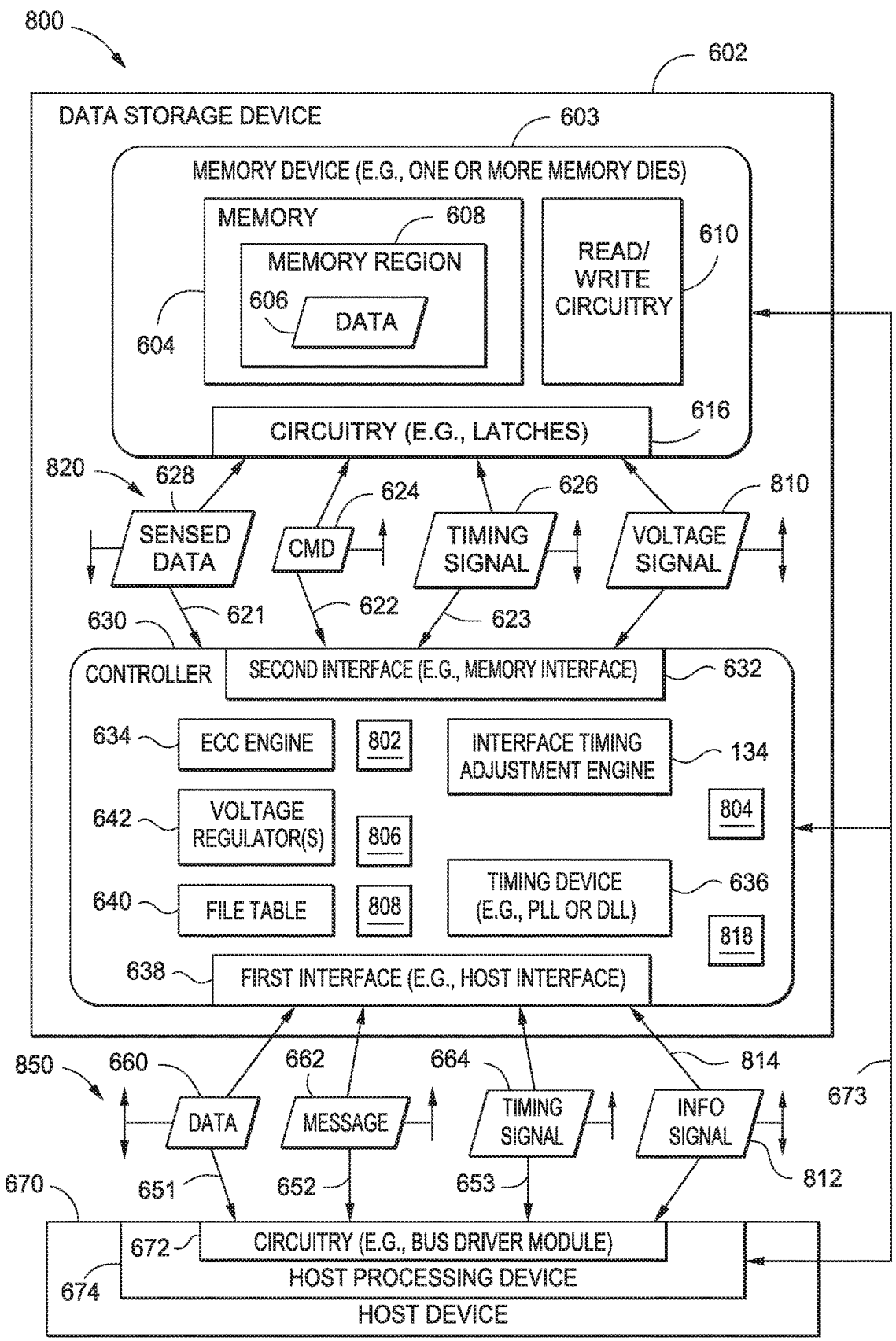
FIG. 8 is a block diagram of a particular illustrative example of a data storage system according to one embodiment.

FIG. 8 is a block diagram of a particular illustrative example of a data storage system 800 according to one embodiment. The data storage system 800 includes many of the components from system 600, but additionally includes a temperature sensor 802 in the controller 630, a voltage sensor 804 in the controller 630, an host input module 806 in the controller 630, an internal inputs monitor 808 in the controller 630, and a device lifetime monitor 818 in the controller 630. The controller 630 is connected to the memory device 603 by connection 820, and the controller 620 is connected to the host device 670 by connection 850.

The system 800 operates automatically to dynamically adjust frequency and/or voltage of the memory interface 632 taking into account inputs from both the host interface 638 and the data storage device 602 condition. Inputs from the host can include the host configuration. For example, the bus mode which is the circuitry 672 of the host device 670. Information on the bus mode can include the frequency of the circuitry 672. Additionally, host configuration information may include the host power class which will indicate the power level at which the host device 670 operates. Another source of information from the host device 670 is the host platform information such as the power specifications and the high/low power levels for the host device 670.

Information for may also be obtained from the internal inputs such as the capacitance of the data storage device 602 (i.e., the number of memory dies 604) or system bottlenecks such as the max LDPC decode time, the memory programming time, parallelism, the number of FIMs, and the device state (BLR, operational).

Additional or alternative information includes the memory device 603 lifetime, temperature of the memory device 603 and the voltage of the memory interface 632.

The information from the host device 670 is transmitted via an info signal 812 and connection 814 to the host input module 806. The information is used to determine if any adjustment to the memory interface 632 frequency or voltage is necessary. Similarly, information from the temperature sensor 802, voltage sensor 804, device lifetime monitor 818 are used to determine if any adjustment to the memory interface 632 frequency or voltage is necessary. Finally, information from the internal inputs monitor 808 are used to determine if any adjustment to the memory interface 632 frequency or voltage is necessary. If any adjustment of the frequency is necessary, the frequency of the timing signal 626 is adjusted. If any adjustment of the voltage is necessary, the voltage signal 810 is adjusted.

Figure 9:
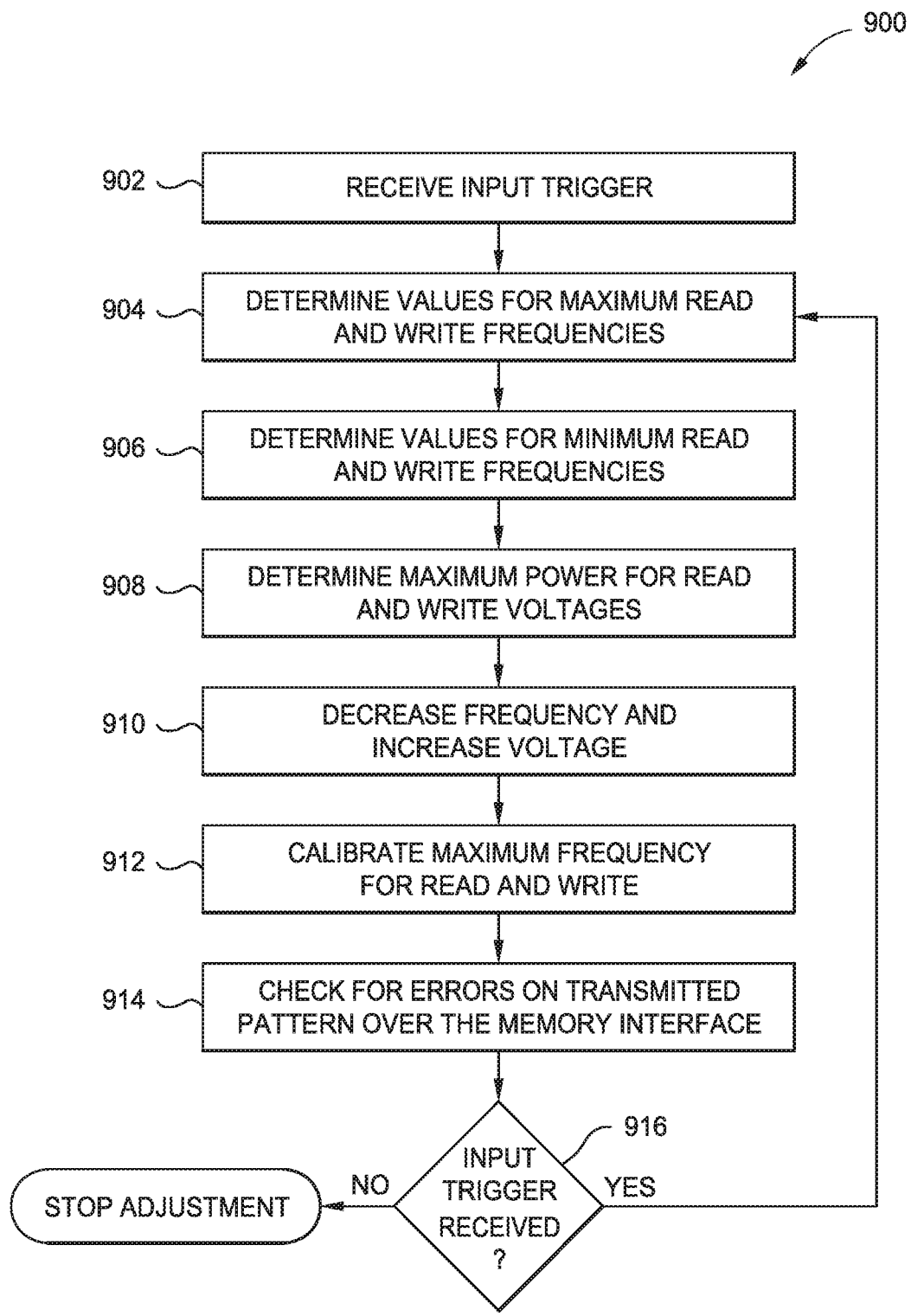
FIG. 9 is a flowchart of an illustrative example of a method according to one embodiment.

FIG. 9 is a flowchart of an illustrative example of a method 900 according to one embodiment. The process begins when an input trigger is received at block 902. The input trigger can be information from the host device such as the host configuration or the host platform information. The host configuration can include the bus mode and the power class. The host platform information can include the internal inputs. Additionally, the input trigger can be information from the storage device such as the system bottlenecks which may include the maximum LDPC decode time, the memory programming time, parallelism, the number of FIMS, and the device state (BLR, operation). Additionally, the input trigger can be information obtaining from a temperature sensor, a voltage sensor or an indication of the device lifetime. It is to be understood that the input trigger may include a single bit of information or a combination of any of the input trigger information elements discussed herein.

Once the input trigger has been received, the values for the maximum read and write frequencies for the memory interface are determined in block 904. Additionally, in block 906, the values for the minimum read and write frequencies for the memory interface are determined, while in block 908 the maximum power for read and write voltages is determined. It is to be understood that the determination occurring in blocks 904, 906, 908 need not occur sequentially, but rather, may occur simultaneously or in a different order. The determinations are the initial values that comply with the maximum read and write power that can be consumed by the memory interface.

Assuming the frequency starts at the maximum frequency and the voltage starts at the minimum voltage, then in block 910 the frequency is decreased and the voltage is increased due to the input trigger information.

Thereafter, in block 912, the frequency values is calibrated to obtain the maximum possible frequency within the range of Fx<Fmax (maximum frequency), & Px<Pmax (maximum power). At block 914, a transmitted pattern on the memory interface is checked for errors through write-read-compare. Additionally, the number of errors is checked to ensure the total number of errors is below a pre-defined threshold (e.g. zero errors).

At block 916, a determination is made regarding whether an input trigger has been received. If no input trigger is received, then the adjustment ends. If there has been an input trigger received, then the process repeats a block 904. The input trigger could be information such as a host power mode change, a temperature measurement timer, or any other internal or external input interrupt as discussed above.

Figure 10:
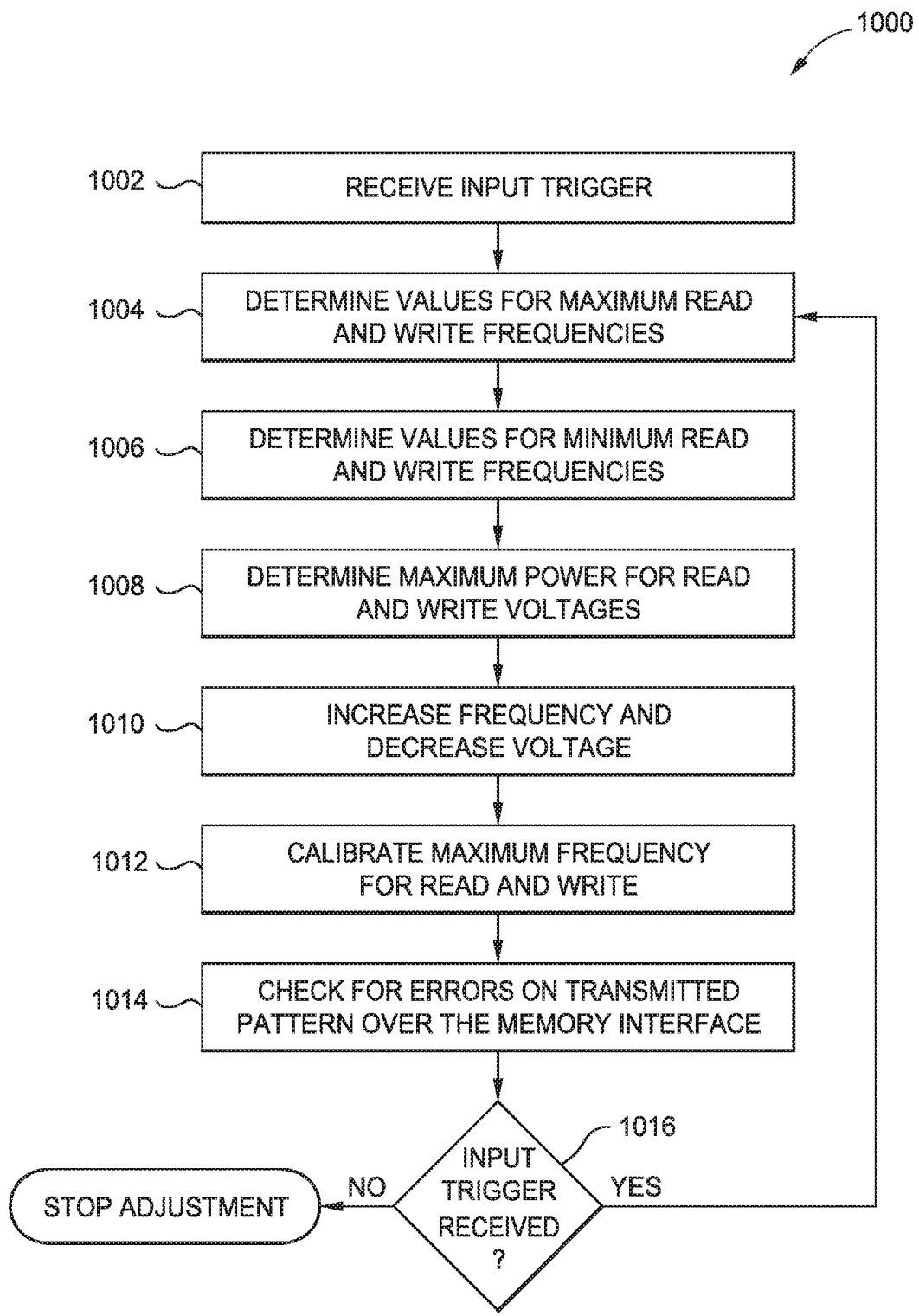
FIG. 10 is a flowchart of an illustrative example of a method according to one embodiment.

FIG. 10 is a flowchart of an illustrative example of a method 1000 according to one embodiment. The process begins when an input trigger is received at block 1002. The input trigger can be information from the host device such as the host configuration or the host platform information. The host configuration can include the bus mode and the power class. The host platform information can include the internal inputs. Additionally, the input trigger can be information from the storage device such as the system bottlenecks which may include the maximum LDPC decode time, the memory programming time, parallelism, the number of FIMS, and the device state (BLR, operation). Additionally, the input trigger can be information obtaining from a temperature sensor, a voltage sensor or an indication of the device lifetime. It is to be understood that the input trigger may include a single bit of information or a combination of any of the input trigger information elements discussed herein.

Once the input trigger has been received, the values for the maximum read and write frequencies for the memory interface are determined in block 1004. Additionally, in block 1006, the values for the minimum read and write frequencies for the memory interface are determined, while in block 1008 the maximum power for read and write voltages is determined. It is to be understood that the determination occurring in blocks 1004, 1006, 1008 need not occur sequentially, but rather, may occur simultaneously or in a different order. The determinations are the initial values that comply with the maximum read and write power that can be consumed by the memory interface.

Assuming the frequency starts at the minimum frequency and the voltage starts at the maximum voltage, then in block 1010 the frequency is increased and the voltage is decreased due to the input trigger information.

Thereafter, in block 1012, the frequency values is calibrated to obtain the maximum possible frequency within the range of Fx<Fmax (maximum frequency), & Px<Pmax (maximum power). At block 1014, a transmitted pattern on the memory interface is checked for errors through write-read-compare. Additionally, the number of errors is checked to ensure the total number of errors is below a pre-defined threshold (e.g. zero errors).

At block 1016, a determination is made regarding whether an input trigger has been received. If no input trigger is received, then the adjustment ends. If there has been an input trigger received, then the process repeats a block 1004. The input trigger could be information such as a host power mode change, a temperature measurement timer, or any other internal or external input interrupt as discussed above.

Figure 11:
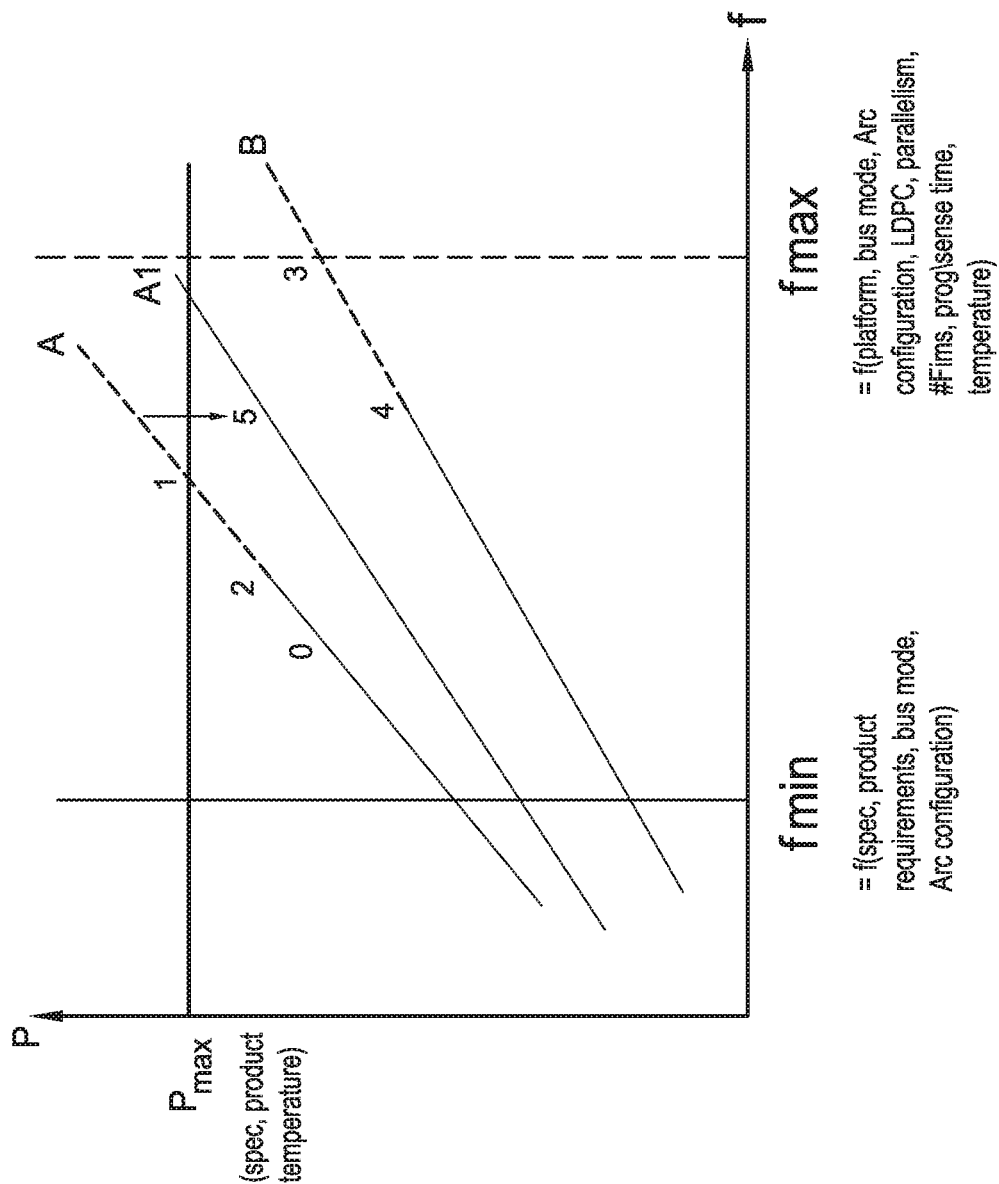
FIG. 11 is a graph illustrating power, voltage and frequency ranges that may be determined by the methods described herein.

FIG. 11 is a graph illustrating power, voltage and frequency ranges that may be determined by the methods described herein. The "Y" axis is power, the "X" axis is frequency. Case A shows a line of frequency optimization starting at point 0 in the middle of the allowed box range. The method involves increasing the frequency until the maximum frequency below Pmax is achieved. Pmax for Case A is point 1. The Pmax is defined by the specification, product requirements and temperature constraints. In some disputations, the conditions of the system may prefer point 2 which is below Pmax due to other considerations such as control module limitations that makes higher bandwidth redundant. Since the controller module limitations are not the bottleneck in the system, increasing the interface frequency will make a redundant increase in power. Case A includes starting from point 0, which is the worst case frequency for static parameters. Calibration is performed with success up to at least point 1, and point 2.

Case B shows a lower power mode line of optimization where the maximum frequency point is point 3 below Pmax. The system may still prefer to optimally operate at a lower frequency, such as point 4, due to other considerations. In Case B, calibration up to at least point 3 and point 4 is successful.

For Case A1, another line of frequency optimization is shown where the interface voltage is decreased. The automated dynamic calibration system may prefer point 5 below the allowed maximum power and frequency due to system considerations. In Case A1, after the voltage decrease, point 5 is obtained.

System considerations may include any requests from the host device, the memory dies or from internal controller modules that may operate, for example, with maximum frequency temporarily due to any bottleneck that may occur dynamically, such as temporarily lacking buffer resources (i.e., TRAM, cache RAM, etc.), temporarily full command submissions, temporarily full completion queues, etc.

By utilizing a dynamic recalibration storage interface system, device performance and endurance is increased. Prior to using the dynamic recalibration, interface frequency calibration was fixed for the device lifetime. With dynamic recalibration, variations due to the environment and mode of operations can be accounted for and unnecessarily overkill safety and reliability margins (which reduce performance and endurance of devices) may be scrapped. The dynamic recalibration uses the write-read-compare error threshold over the memory interface to recalibrate the interface frequency dynamically according to host side information, memory side information or controller limitations in real time.

In one embodiment, a method comprises determining initial values of a memory interface of a data storage device, wherein the initial values include a minimum write frequency, a minimum read frequency, a maximum write frequency and a maximum read frequency; receiving an input trigger; adjusting frequency and voltage of the memory interface; calibrating the frequency to obtain a maximum possible frequency for the memory interface; and checking a transmitted pattern across the memory interface for errors. The input trigger is selected from the group consisting of: host configuration information, host platform information, data storage device internal inputs, device lifetime information, device temperature, voltage, and combinations thereof. The initial values of the memory interface comply with a maximum read and write power that can be consumed by the memory interface. Checking for errors includes read-write comparing. Checking for errors also includes ensuring a number of errors is below a predefined threshold. The method additionally comprises receiving a new input trigger; and repeating the adjusting, calibrating and checking. Adjusting the frequency comprises increasing the frequency. Adjusting the voltage additionally comprises decreasing the voltage.

In another embodiment, a method comprises determining initial values of a memory interface of a data storage device, wherein the initial values include a minimum write frequency, a minimum read frequency, a maximum write frequency and a maximum read frequency; decreasing the frequency of the memory interface; increasing voltage to the memory interface; and repeating the determining, decreasing and increasing while ensuring a number of errors observed remains below a predefined threshold. The method further comprises receiving information regarding host device bus mode configuration or host device power class configuration, wherein the receiving occurs prior to decreasing the frequency. The method additionally comprises receiving information regarding host device power specifications or host device power high and low power configurations, wherein the receiving occurs prior to decreasing the frequency. The method also comprises receiving information regarding data storage device bottlenecks or data storage device capacitance, wherein the receiving occurs prior to decreasing the frequency. The data storage device bottlenecks includes information regarding one or more of maximum LDPC decode time, memory device programming time, parallelism, number of FIMs, and memory device state. The method further comprises receiving information data storage device lifetime, wherein the receiving occurs prior to decreasing the frequency. The method further comprises receiving information regarding detected data storage device temperature, wherein the receiving occurs prior to decreasing the frequency. The method additionally includes receiving information regarding detected data storage device voltage, wherein the receiving occurs prior to decreasing the frequency.

In another embodiment, a data storage device comprises one or more memory devices; and a controller coupled to the one or more memory devices, wherein the controller includes: a host interface for coupling the data storage device to a host device; a memory interface for coupling the one or more memory devices to the controller; a voltage regulator; an interface timing adjustment engine; and one or more of: an internal inputs monitor; a host inputs module; a device lifetime monitor; a temperature sensor; and a voltage sensor, wherein the controller is configured to adjust one or more of a frequency or a voltage of the memory interface based upon information received from one or more of the internal inputs monitor, host inputs module, device lifetime monitor, temperature sensor and voltage sensor. The controller is configured to adjust a frequency of the memory interface. The controller is configured to adjust a voltage of the memory interface. The controller is configured to receive one or more of the following: host device bus mode configuration, host device power class configuration, host device power specifications, and host device power high and low power configurations. The controller is configured to receive one or more of the following: maximum LDPC decode time, memory device programming time, parallelism, number of FIMs, memory device state, memory device lifetime, memory device temperature, and memory interface voltage.

In another embodiment, a data storage device comprises means to receive inputs regarding one or more of the following: internal device inputs, host inputs, device lifetime, temperature, and voltage; means to adjust frequency of a memory interface of the data storage device wherein the means to adjust frequency is coupled to the means to receive inputs; and means to adjust voltage of the memory interface, wherein the means to adjust voltage is coupled to the means to receive inputs. The data storage device further comprises means to receive one or more of the following: host device bus mode configuration, host device power class configuration, host device power specifications, host device power high and low power configurations, maximum LDPC decode time, memory device programming time, parallelism, number of FIMs, memory device state, memory device lifetime, memory device temperature, and memory interface voltage. The data storage device further comprises means for calibrating frequency of the memory interface. The data storage device further comprising means for checking a transmitted pattern for errors.

In another embodiment, a data storage system comprises a host device; and a data storage device coupled to the host device, the data storage device including: one or more memory devices; and a controller coupled to the one or more memory devices, the controller configured to receive inputs from one or more of the following: internal device inputs, host inputs, device lifetime, temperature, and voltage, the controller also configured to adjust frequency and voltage of a memory interface of the data storage device based upon the received inputs. The controller is further configured to increase frequency of the memory interface and simultaneously decrease voltage of the memory interface. The controller is further configured to decrease frequency of the memory interface and simultaneously increase voltage of the memory interface.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device, comprising:
   one or more memory devices;
   a comparator;
   a plurality of latches coupled to the comparator; and
   a controller coupled to the one or more memory devices, the controller comprising:
      a host interface for coupling the data storage device to a host device;
      a memory interface for coupling the one or more memory devices to the controller;
      a voltage regulator;
      an interface timing adjustment engine, wherein the interface timing adjustment engine is configured to adjust a frequency of a timing signal; and
      one or more of:
         an internal inputs monitor;
         a host inputs module;
         a device lifetime monitor;
         a temperature sensor; and
         a voltage sensor,
      wherein the controller is configured to:
         adjust one or more of the frequency of the timing signal or a voltage of the memory interface within a constraint and based upon information received from one or more of the internal inputs monitor, host inputs module, device lifetime monitor, temperature sensor, and voltage sensor;
         determine values for maximum read and write frequencies;
         determine values for minimum read and write frequencies;
         determine maximum power for read and write voltages;
         decrease frequency and increase voltage;
         calibrate maximum frequency for read and write;
         check for errors on one or more transmitted patterns over the memory interface;
         determine a first data pattern at a first frequency;
         determine a second data pattern at a second frequency;
         determine, using the plurality of latches working in conjunction with the controller, whether the first data pattern equals the second data pattern;
         increase the first frequency if the first data pattern equals the second data pattern; and
         decrease the first frequency if the first data pattern does not equal the second data pattern.

2. The data storage device of claim 1, wherein the controller is further configured to adjust the voltage of the memory interface within the constraint and based upon the information received from one or more of the internal inputs monitor, host inputs module, device lifetime monitor, temperature sensor and voltage sensor.

3. The data storage device of claim 1, wherein the controller is further configured to receive one or more of the following: host device bus mode configuration, host device power class configuration, host device power specifications, and host device power high and low power configurations.

4. The data storage device of claim 1, wherein the controller is further configured to receive one or more of the following: maximum LDPC decode time, memory device programming time, parallelism, number of FIMs, memory device state, memory device lifetime, memory device temperature, and memory interface voltage.

5. The data storage device of claim 1, wherein the constraint includes that the frequency of the timing signal does not exceed a maximum frequency and a power of the memory interface does not exceed a maximum power.

6. A data storage device, comprising:
means to receive inputs regarding one or more of the following: internal device inputs, host inputs, device lifetime, temperature, and voltage means to adjust a frequency of a timing signal of the data storage device;
means to maximize, within a constraint, frequency of a timing signal of a memory interface of the data storage device, wherein the means to maximize is coupled to the means to receive inputs;
means to adjust, within the constraint, voltage of the memory interface, wherein the means to adjust voltage is coupled to the means to receive inputs;
means to determine values for maximum read and write frequencies;
means to determine values for minimum read and write frequencies;
means to determine maximum power for read and write voltages;
means to decrease frequency and increase voltage;
means to calibrate maximum frequency for read and write;
means to check for errors on one or more transmitted patterns over the memory interface;
means to determine a first data pattern at a first frequency;
means to determine a second data pattern at a second frequency;
a comparator;
means to determine whether the first pattern equals the second pattern;
means to increase the first frequency if the first data pattern equals the second data pattern; and
means to decrease the first frequency if the first data pattern does not equal the second data pattern.

7. The data storage device of claim 6, further comprising means to receive one or more of the following: host device bus mode configuration, host device power class configuration, host device power specifications, host device power high and low power configurations, maximum LDPC decode time, memory device programming time, parallelism, number of FIMs, memory device state, memory device lifetime, memory device temperature, and memory interface voltage.

8. A data storage system, comprising:
a host device; and
a data storage device coupled to the host device, the data storage device including:
one or more memory devices;
a comparator;
a plurality of latches coupled to the comparator; and
a controller coupled to the one or more memory devices, the controller configured to:
receive inputs from one or more of:
internal device inputs;
host inputs;
a device lifetime;
a temperature; and
a voltage;
adjust a frequency of a timing signal using an interface timing adjustment engine;
adjust a maximize frequency of a timing signal of a memory interface of the data storage device and a voltage of the memory interface of the data storage device, the maximizing the frequency and adjusting the voltage being within a constraint and based upon the received inputs;
determine values for maximum read and write frequencies;
determine values for minimum read and write frequencies;
determine maximum power for read and write voltages;
decrease frequency and increase voltage;
calibrate maximum frequency for read and write;
check for errors on one or more transmitted patterns over the memory interface;
determine a first data pattern at a first frequency;
determine a second data pattern at a second frequency;
determine, using the plurality of latches working in conjunction with the controller, whether the first data pattern equals the second data pattern;
increase the first frequency if the first data pattern equals the second data pattern; and
decrease the first frequency if the first data pattern does not equal the second data pattern.

9. The data storage system of claim 8, wherein, to determine the maximized frequency and adjusted voltage, the controller is further configured to increase frequency of the memory interface and simultaneously decrease voltage of the memory interface.

10. The data storage system of claim 8, wherein, to determine the maximized frequency and adjusted voltage, the controller is further configured to decrease frequency of the memory interface and simultaneously increase voltage of the memory interface.

11. The data storage device of claim 8, wherein the constraint includes that the frequency of the timing signal does not exceed a maximum frequency and a power of the memory interface does not exceed a maximum power.

* * * * *